United States Patent
Wang

[11] Patent Number: 5,903,146
[45] Date of Patent: May 11, 1999

[54] DISTRIBUTING TEST SYSTEM AND METHOD

[75] Inventor: Giant Wang, Ping-Cheng, Taiwan

[73] Assignee: Delta Electronics, Inc., Taipei, Taiwan

[21] Appl. No.: 08/659,069

[22] Filed: Sep. 5, 1996

Related U.S. Application Data

[63] Continuation of application No. 08/032,452, Mar. 17, 1993, abandoned.

[51] Int. Cl.⁶ .................................................. G01R 31/02

[52] U.S. Cl. ...................................... 324/158.1; 324/73.1

[58] Field of Search .................................. 324/772, 754, 324/73.1, 158.1, 760; 364/468, 478

[56] References Cited

U.S. PATENT DOCUMENTS

| | | | |
|---|---|---|---|
| 3,039,604 | 6/1962 | Bickel et al. | 324/158 F |
| 3,541,440 | 11/1970 | Silverman | 371/27 |
| 3,758,857 | 9/1973 | Simpson et al. | 324/158 MG |
| 3,845,286 | 10/1974 | Aronstein et al. | 364/478 |
| 5,444,386 | 8/1995 | Mizumura | 324/754 |

*Primary Examiner*—Ernest F. Karlsen
*Attorney, Agent, or Firm*—Bo-In Lin

[57] ABSTRACT

The present invention comprises a system for testing a manufacture. The testing system comprises at least two test means wherein each of the test means is capable of testing at least a performance parameter of the manufacture. The test means are distributed in a production line of the manufacture for performing the tests of the performance parameters on the manufacture.

7 Claims, 3 Drawing Sheets

DISTRIBUTING TEST SYSTEM AND METHOD

This application is a continuation of Ser. No. 08/032,452, filed Mar. 17, 1993, now abandoned.

BACKGROUND OF THE INVENTION

1. Field of the Invention

This invention relates generally to a testing system and method used for quality and performance test as part of an integrated manufacture and testing system. More particularly, this invention relates to an improved system architecture and method wherein the testing equipments are optimally distributed whereby the productivity of manufacture is increased because the tests are performed in parallel and the time required for maintenance and repair of the testing system is decreased.

2. Description of the Prior Art

The processing speed and the reliability of the on-line testing equipments are imposing ever more limitations on the productivity of a manufacturing line. This is caused by the facts that the number of tests to be performed for each single device are increased and meanwhile each of these tests are functionally more complicate while demanding more stringent accuracy in parameter measurements. Such trend is expected to continue and become even more intensified since the manufacture technology is moving toward a higher level of functional integration while aided by modern electronic technology, each function is now enabled to perform more complex processes. The bottle neck caused by the testing through-put must be resolved if high productivity with one-hundred percent quality assurance testing are to be achieved in a modern high-speed production line.

In response to technology's continuous movement to a high level of functional integration in manufacturing, a trend of 'testing integration' also seems to appear in parallel. This trend of testing integration is aided in a great deal by the availability of testing computer which can automnate and schedule a plurality a tests in a single 'testing station'. A typical testing station is disclosed in U.S. Pat. No. 4,807, 161, entitled "Automatic Test Equipment" (issued on Feb. 21,1989 to Comfort et al.), wherein a test station is capable of performing a plurality of functional tests for the electrical printed circuit board (PCB) assemblies. The automatic test equipment (ATE) is constructed as the combination of a 'programmable controller' configured as a micro-computer which has a plurality of selected interface modules. Each interface module includes hardware, i.e., different types of testing instruments, and software for automatically testing the PCB assemblies.

Comfort et al. assert, in U.S. Pat. No. 4,807,161, that the ATE, when configured as an integrated test station, has the advantage of allowing user more flexibility to perform a variety of tests by the use of multiple input and output. Nevertheless, such test configuration often becomes a productivity bottle-neck due to the fact that the multiple functional tests as performed by a single integrated test station is typically placed at the very end of a production line which often requires long test time. As a matter of fact, the more tests the ATE performs the longer testing time it requires and the higher is the probability that the products have to wait in line for the 'final' testing.

In addition to the longer time required for performing the multiple tests by a single test station, the computer-based testing controllers, implemented with software and hardwire, are quite complex and also expensive. Due to its complexity, once there is any malfunction or performance abnormality, the diagnosis and repair of the integrated ATE can be a very time consuming process. The limitation of this prior art technology is further compounded by the fact that once the integrated ATE stops its normal operation the productivity of the entire production line may likely drop to zero unless there are a redundant or backup ATE available for immediate replacement.

In U.S. Pat. No. 4,894,829, entitled 'Comprehensive Design and Maintenance Environment for Test Program Sets" (issued on Jan. 16, 1990 to Monie et al.) wherein a similar ATE system is used. More software features are built in for the testing system to perform a variety of tests aided by database and graphic display for better user interface. The test software even has features for test scheduling whereby a series of tests can be conducted in sequence as scheduled. However, such system can be even more complex and more expensive. Furthermore, it suffers the same difficulties and limitations as encountered by the aforementioned invention disclosed by Comfort et al. Furthermore, the tasks of diagnosis and repair become more difficult once a system problem occurs since the testing system now is much more complicate as it includes electronic hardware and associated software. Most likely, these tasks can only be performed by specially trained field service engineers. The adverse impact to the productivity of a manufacture line may be even more significant if such specially trained engineers are not immediately available.

Therefore, for those skilled in the art, there is still a need for a new and improved test configuration and method. Specifically, this new system and method for performing the multiple parameter testing should allow easy maintenance and repair of the test equipments. Such system should also capable of being optimized such that the online tests and the manufacturing steps can be streamlined to increased the productivity of a production line.

FIG. 1A is a block diagram showing a typical conventional multiple input/output ATE system 100 used to perform a plurality of functional tests on a manufactured product generally referred to as an unit under test (UUT) 105. The UUT 105 as shown is a power supply unit and the ATE system as shown is a Chroma-6000 ATS system. FIG. 1B is a corresponding perspective view of the ATE system 100 shown in FIG. 1A. The ATE system 100 includes a microcomputer 110 which controls the testing processes through a system controller 112 and a connected data-bus interface 114. The micro-computer also has a user interface station 116 which generally includes keyboard, monitor, printer, or plotter thus enabling an ATE operator to monitor and control the test processes.

The UUT 115 are activated by the energy generated by the AC and DC power supply units 120 and 122 and provided to the UUT 105, under the control of the system controller 112, via an extended measurement unit 118 to the input pins of the UUT 124. A plurality of test signals are received, under the control of the system controller 112, by different switch analyzer 130 from the output testing pins 132 of the UUT 105. The output test signals from the UUT 105 are then received and analyzed by the switch analyzers 130 and the computer 110. The quality of the product, e.g., a power supply unit, is certified and finally released for further processing based on the result of these multiple tests.

The ATE system 100 therefore more clearly illustrates that the prior art technique is limited by the fact that all the tests are performed by a single and very complex system in a strictly serial manner. As a result of that limitation, the process of these tests are more time consuming because no multiple tests are performed in parallel. Additionally, the combined ATE system becomes very complex and difficult to repair and maintain once a system malfunction occurs.

SUMMARY OF THE PRESENT INVENTION

It is therefore an object of the present invention to provide a distributed testing configuration and method to overcome the limitations and difficulties encountered by the prior art testing system and method.

Another object of the present invention is to provide a distributed testing configuration and method wherein the test equipments can be flexibly distributed in a production line to achieve overall optimal production process.

Another object of the present invention is to provide a distributed testing configuration and method wherein the test equipments are distributed in a production line to perform pre designated test at the corresponding stage by use of a specific set of test equipments.

Another object of the present invention is to provide a distributed test configuration and method utilizing standard micro-processors and their interface modules such that maintenance and repair work can be easily carried out.

Another object of the present invention is to provide a distributed testing configuration and method utilizing standard micro-processors and their interface modules such that the cost of the test equipments and the associated production cost can be decreased Another object of the present invention is to provide a distributed testing configuration and method for early detecting and rejection of defective products in a production line such that the production cost can be decreased Briefly, in a preferred embodiment, the present invention comprises a system for testing a manufacture. The testing system comprises at least two test means wherein each of the test means is capable of testing at least a performance parameter of the manufacture. The test means are distributed in a production line of the manufacture for performing the tests of the performance parameters on the manufacture.

One advantage of the present invention is that it provides a distributed testing configuration and method to overcome the limitations and difficulties encountered by the prior art testing system and method.

Another advantage of the present invention is that it provides a distributed testing configuration and method wherein the test equipments can be flexibly distributed in a production line to achieve overall optimal production process.

Another advantage of the present invention is that it provides a distributed testing configuration and method wherein the test equipments are distributed in a production line to perform pre designated test at the corresponding stage by use of a specific set of test equipments.

Another advantage of the present invention is that it provides a distributed test configuration and method utilizing standard micro-processors and their interface modules such that maintenance and repair work can be easily carried out.

Another advantage of the present invention is that it provides a distributed testing configuration and method utilizing standard micro-processors and their interface modules such that the cost of the test equipments and the associated production cost can be decreased.

Another advantage of the present invention is that it provides a distributed testing configuration and method for early detecting and rejection of defective products in a production line such that the production cost can be decreased.

Another advantage of the present invention is that it provides a distributed testing system and method for a wide variety of products such that the distributed testing system can be easily converted adaptable to future production lines to manufacture different types of products.

These and other objects and advantages of the present invention will no doubt become obvious to those of ordinary skill in the art after having read the following detailed description of the preferred embodiment which is illustrated in the various drawing figures.

DETAILED DESCRIPTION OF THE PREFERRED EMBODIMENT

Figure 1A:
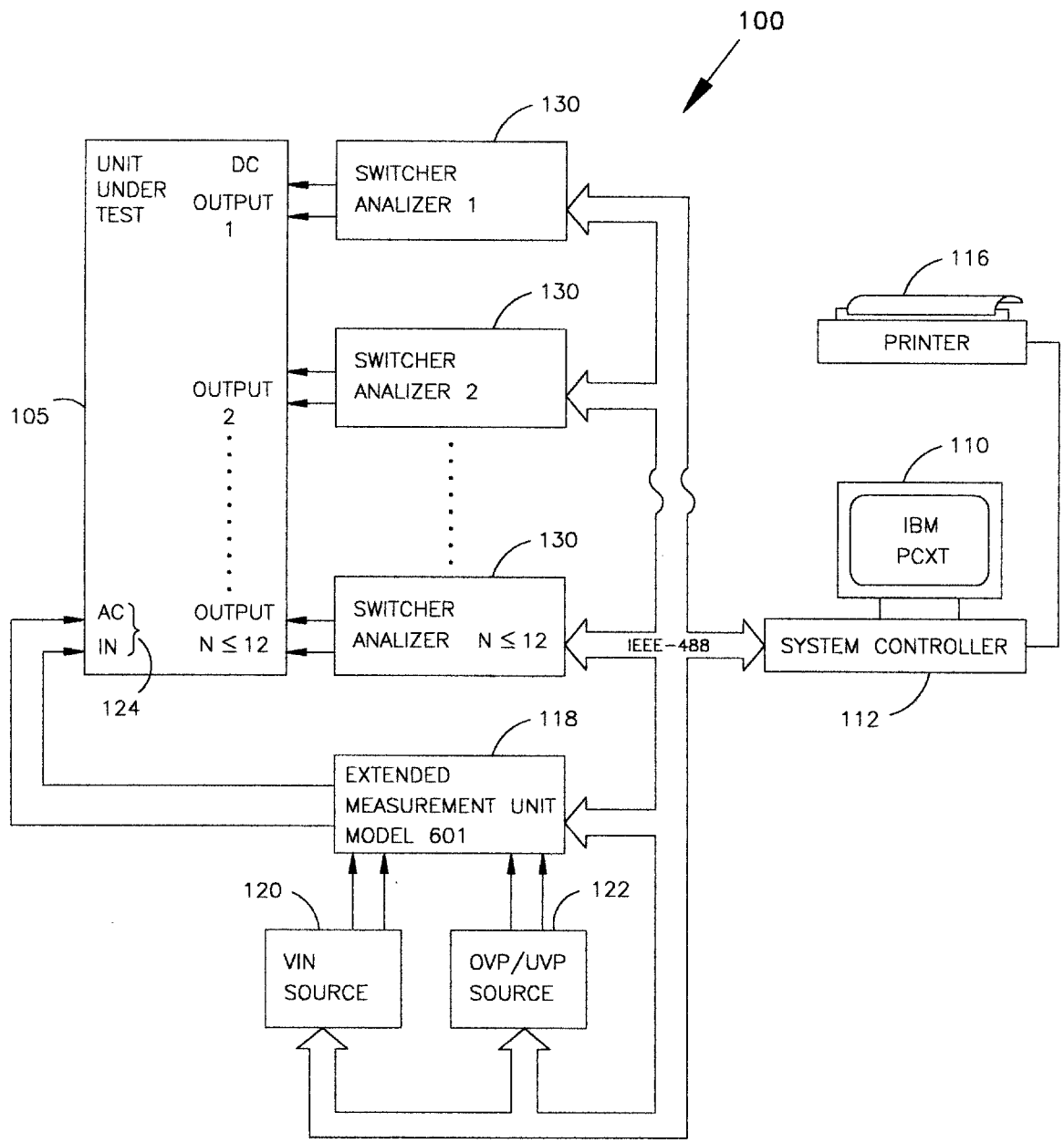
FIG. 1A is a block diagram showing an automatic test equipment system for testing an UUT, i.e., power supply unit.
Figure 1B:
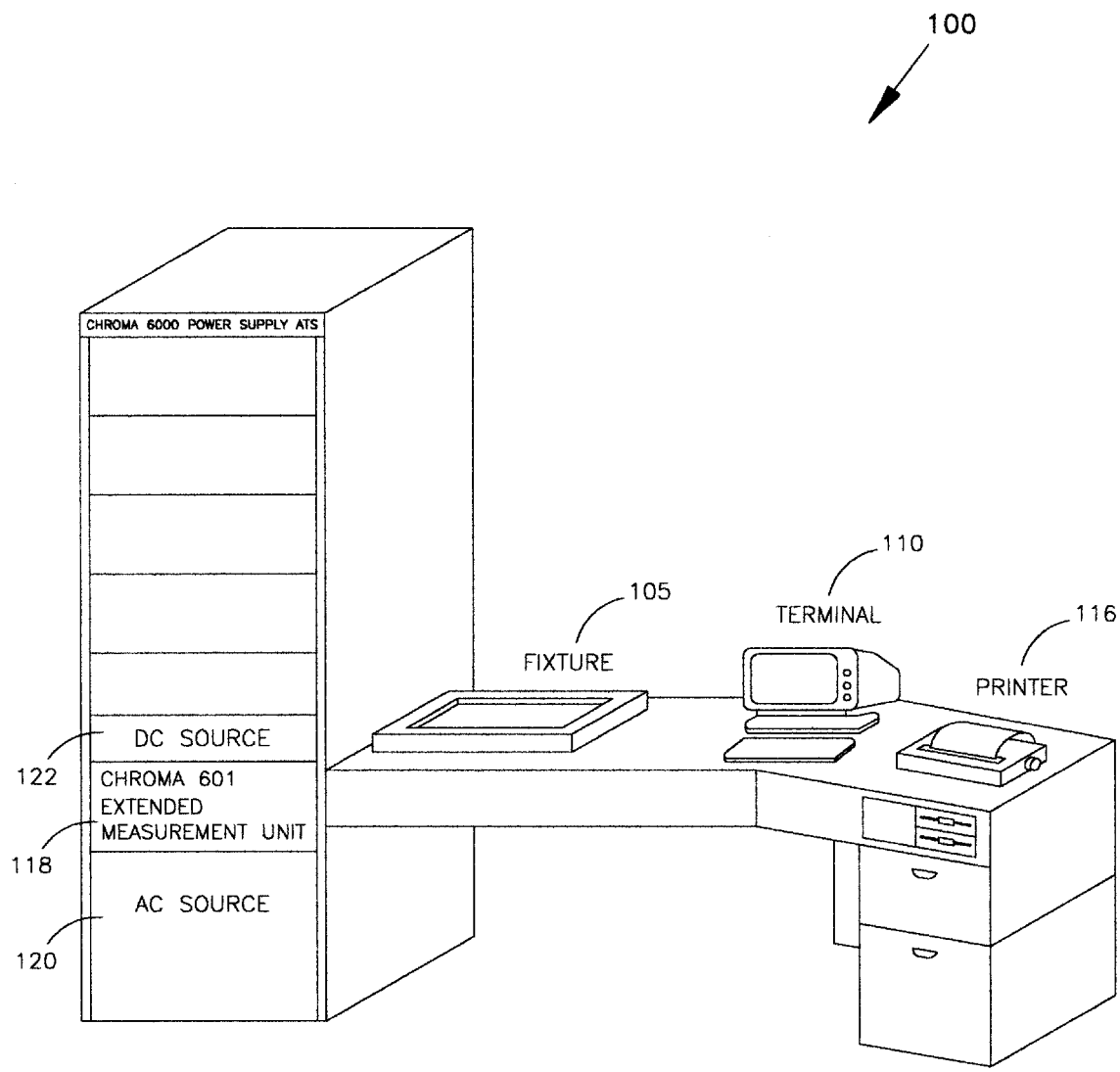
FIG. 1B is a perspective view of the automatic test equipment system of FIG. 1A.
Figure 2:
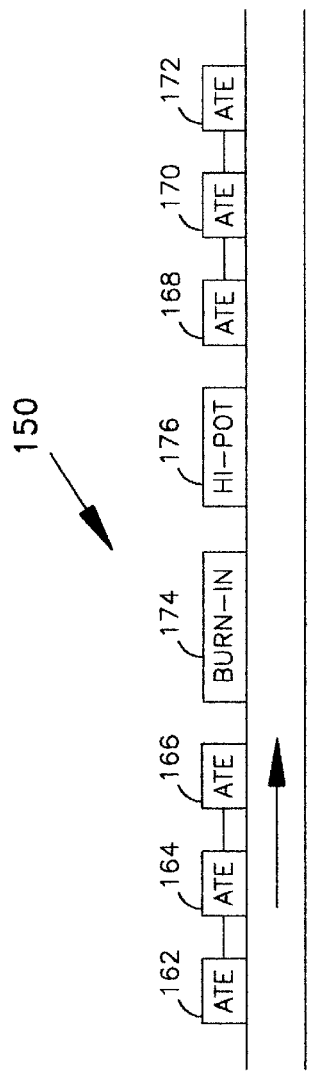
FIG. 2 is a block diagram showing a distributed test system comprising a plurality of sub-ATE systems according to the present invention.

FIG. 2 shows a distributed test system 150 which has a distributed test-configuration according to the present invention. The test system 150 comprises a plurality of sub-ATE systems 162, 164, 166, 168, 170, and 172 wherein each sub-ATE system is controlled by either a computer or a microprocessor with local memory and user interface means. In order to test a power supply, FIG. 2 shows that a burn-in process 174 and a high potential test 176 are performed after a series of tests are performed by a first set of distributed sub-ATE systems 162 to 166. For more details of the required tests for a power supply UUT which are to be performed by each of these sub-ATE (automatic test equipments), please refer to User's Manual of Chroma-6000 ATS. Since a list of tests and the functions for each of these tests are typically performed according to an industrial standard and are well known in the art, no further descriptions will be provided as these details can be found in Chroma's and many other user's manuals of different test equipments. An improvement in test time is achieved by the distributed test system 150 because six sets of tests are now performed in parallel by six sub-ATE systems. Unlike the conventional testing technique, the tests performed by each sub-ATE system can proceed without the unnecessary delay to wait for the completion of prior tests performed by another sub-ATE system. By reducing the number of testing parameters for each sub-ATE system, the repair and maintenance tasks are also simplified. The impact on productivity due to the down time of these sub-ATE systems are thus reduced compared to the conventional single ATE test system.

Figure 3:
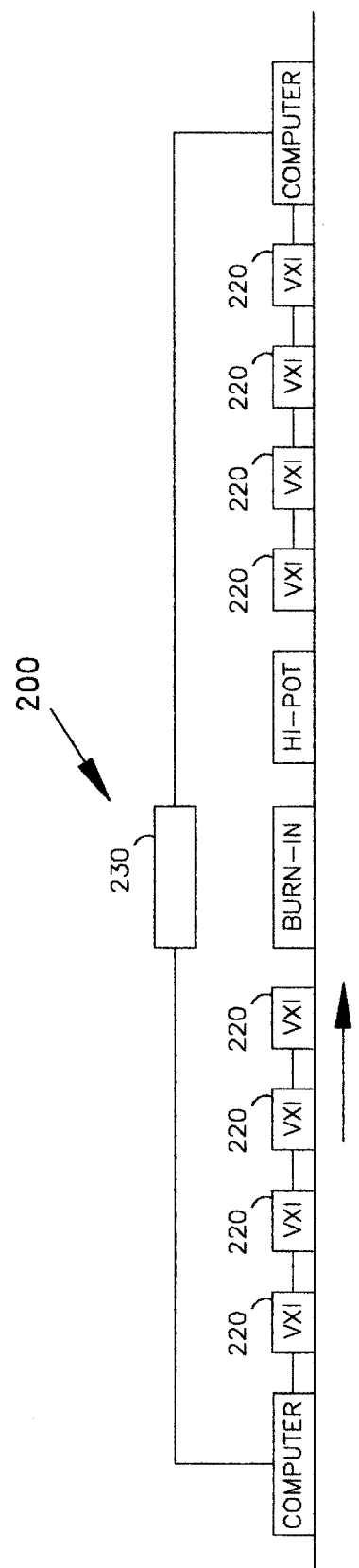
FIG. 3 is a block diagram showing a distributed test system comprising a plurality of virtual cross interface (VXI) test means.

FIG. 3 shows another preferred embodiment of the present invention wherein a distributed test system 200 is used to test the power supply products on a production line 210. The test system 200 comprises a plurality of $V_{ME}$ (versatile-modular-easy-card) extension for instrument (VXI) boxes 220. Every VXI box 220 is a standardized interface module which includes a central process unit (CPU) card, a memory card and a general purpose interface board (GPIB) card. The GPIB card is standardized such that the GPIB can be connected with standard adoptive plug/pin interface to a variety of test boards and computers/ processors. The VXI boxes are controlled by a central system controller 230 which monitor the production processes on the production line 210. A set of pre designated test program can be down-loaded from the central system computer 230 to the memory of each VXI box 220. The details of the structure, functions, and standards of VXI are described in HP75000 Family of VM Products published by Hewlett Packard in May 1992. There are several VXI vendors and the techniques for employing VXI for providing flexible and versatile interface for testing equipments with the unit under test (UUT) are well known in the art and will not be further described in here in the specification.

The VXI box, i.e., the standardized interface module, can be flexibly configured to perform different type of tests by plugging in different types of modular testing boards and by loading corresponding testing software. Taking advantage of this flexibility, the configuration of the distributed test system 200 of the present invention configures the standardized interface module, i.e., the VXI boxes 220, in many different ways to perform different test or different set of tests. The test sequence can be streamlined such that the test(s) to be performed by each VXI box 220 is approximately equal thereby the delay in waiting for the completion of a prior or next test can be minimized. Since the test board for performing each functional test or a combination of tests are standardized to be compatible with the standard VXI box 220, and these boards are usually manufactured in large quantity by mass production method. The equipment cost of the test system 200 can be maintained at a very low level. Furthermore, whenever there is a malfunction of any VXI box 220 in the test system 200, the problem can generally be resolved by replacing a PC board for the VXI box 220. This task can be easily handled by any technician with minimal knowledge of the test system or the boards themselves. The diagnosis and repair can be performed off-line while the productivity of the production line is not affected at all.

Although the present invention has been described in terms of the presently preferred embodiment, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

I claim:

1. A distributed flexibly modularized test system for performing a functional test for testing a manufacture of an electric system including a plurality of subsystems by applying an VXI test standard in a production line comprising:

at least two standardized VXI test interface modules each including at least a standardized VXI modularized test means wherein each of said standardized VXI modularized test means being provided for testing at least a performance parameter of one of said subsystems wherein said standardized VXI test interface modules being distributed in said production line with at least a manufacture processing station disposed between two of said standardized VXI test interface modules for sequentially testing said manufacture in a predetermined order; and each of said standardized VXI modularized test means being provided for flexibly removal from each of said standardized VXI test interface modules and for flexible installation in each of said standardized VXI test interface modules whereby said distributed test system is provided for convenient reconfiguration by simply changing said standardized VXI modularized test means in each of said standardized VXI test interface modules.

2. The distributed test system for testing an electric system of claim 1 wherein:

each of aid standardized VXI test interface modules being a virtual cross interface (VXI) instrument box and each of said standardized VXI modularized testing means being a standardized VXI-compatible test card for flexibly removing from and installing onto said VXI instrument box.

3. The distributed test system for testing an electric system of claim 2 wherein:

each of said VXI instrument boxes including a general purpose interface board (GPIB) for adapting said VXI-compatible card thereon; and each of said VXI-compatible card including a central processing unit (CPU), a memory and a standardized interface means for removably attaching to said GPIB).

4. The system for testing an electric system of claim 3 wherein:

said memory in said VXI-compatible card further including a test program provided for execution by said CPU for testing said manufacture.

5. A distributed flexibly modularized test system for performing a functional test for testing a manufacture of an electric system including a plurality of subsystems by applying an VXI test standard in a production line comprising:

at least two standardized VXI test interface modules each including a standardized VXI modularized test means wherein each of said standardized VXI modularized test means being provided for testing at least a performance parameter of one of said subsystems wherein said standardized VXI test interface modules being distributed in said production line with at least a manufacture processing station disposed between two of said standardized VXI test interface modules for sequentially testing said manufacture in a predetermined order; and each of aid standardized VXI test interface modules being a virtual cross interface (VXI) instrument box and each of said standardized VXI modularized testing means being a standardized VXI-compatible test card for flexibly removing from and installing onto said VXI instrument box;

each of said VXI instrument boxes including a general purpose interface board (GPIB) for adapting said VXI-compatible card thereon;

each of said VXI-compatible card including a central processing unit (CPU), a memory and a standardized interface means for removably attaching to said GPIB; and said memory in said VXI-compatible card further including a test program provided for execution by said CPU for testing said manufacture.

6. The distributed test system for testing an electric system claim 5 further comprises:

a test computer including a VXI-compatible data bus connected to each of said each of said VXI instrument boxes for controlling each of VXI-compatible test card to test said manufacture in said production line.

7. The distributed test system for testing said electric system of claim 6 wherein:

said test computer further being provided for performing a test program download to said memory of each of said VXI-compatible test card corresponding to a test to be performed by said standardized VXI modularized test means.

* * * * *